United States Patent [19]

Iizuka

[11] Patent Number: 4,600,275
[45] Date of Patent: Jul. 15, 1986

[54] PROJECTION SYSTEM CAPABLE OF EFFECTING PRECISE FOCUS ADJUSTMENT

[75] Inventor: Kazuo Iizuka, Tokyo, Japan

[73] Assignee: Canon Kabushiki Kaisha, Tokyo, Japan

[21] Appl. No.: 435,332

[22] Filed: Oct. 19, 1982

[30] Foreign Application Priority Data

Oct. 24, 1981 [JP] Japan ................. 56-170607

[51] Int. Cl.⁴ ......................... G02B 3/12; G02B 3/14
[52] U.S. Cl. ................................. 350/418; 350/419
[58] Field of Search ................. 350/418, 419, 414

[56] References Cited

U.S. PATENT DOCUMENTS

| | | | |
|---|---|---|---|
| 1,954,755 | 4/1934 | Heine | 350/414 |
| 3,498,695 | 3/1970 | Brouwer | 350/418 |
| 4,208,101 | 6/1980 | Trapp et al. | 350/414 |
| 4,331,388 | 5/1982 | McCrobie et al. | 350/419 |
| 4,387,970 | 6/1983 | Brueggemann | 350/247 X |

*Primary Examiner*—John K. Corbin
*Assistant Examiner*—Scott J. Sugarman
*Attorney, Agent, or Firm*—Fitzpatrick, Cella, Harper & Scinto

[57] ABSTRACT

Between the object plane and the image plane of a projection optical system, a liquid is held by and between a plurality of plate-like solid optical elements formed of a transparent material, and the spacing between these solid optical elements is varied to vary the layer thickness of the liquid, thereby adjusting the focus position of the optical system.

5 Claims, 2 Drawing Figures

PROJECTION SYSTEM CAPABLE OF EFFECTING PRECISE FOCUS ADJUSTMENT

BACKGROUND OF THE INVENTION

1. Field of the Invention

This invention relates to focus adjustment of an optical system. More particularly, it relates to focus adjustment of a projection optical system for projecting a semiconductor integrated circuit pattern, formed on a mask or a reticle, onto a wafer provided with a photosensitive medium.

2. Description of the Prior Art

To adjust the focus position of a projection optical system, a method of adjusting the distance between an object plane or an image plane and a lens has heretofore often been employed. However, the method in which the object plane or the image plane is moved requires a large spatial margin for distance adjustment, and the method in which the lens is moved involves a great disadvantage because, during its movement, the lens may vibrate causing optical axis displacement which aggravates the quality of the image.

On the other hand, it is known to pour a liquid into a region between two membranes to form a lens and vary the power of the lens by increasing or decreasing the amount of the liquid poured. However, this type of lens has great aberrations and cannot be used for the projection of precise patterns.

SUMMARY OF THE INVENTION

It is an object of the present invention to highly accurately adjust the imaging position of a projection optical system.

It is another object of the present invention to adjust the imaging position with the projection optical system remaining fixed.

It is still another object of the present invention to change the imaging position in accordance with any deformation of the surface of a wafer resulting from warping thereof.

It is yet still another object of the present invention to compensate for any variation in the imaging position of a projection optical system which may be caused by variation in temperature, under such a condition that the spacing between a holder which holds a mask and a wafer chuck which supports a wafer is kept constant.

The invention will become fully apparent from the following detailed description thereof taken in conjunction with the accompanying drawings.

DESCRIPTION OF THE PREFERRED EMBODIMENT

Figure 1:
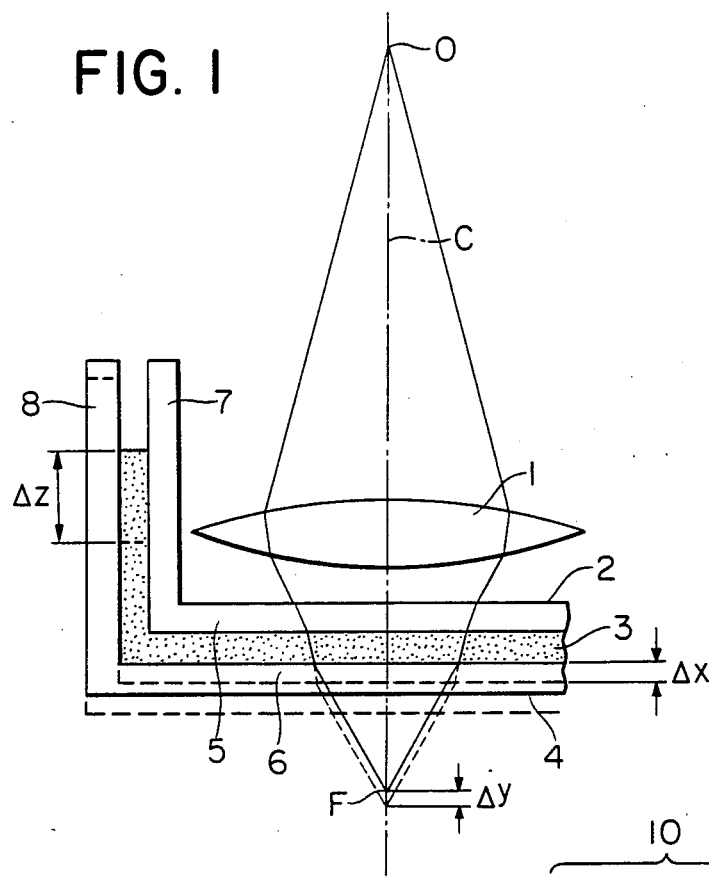
FIG. 1 is a cross-sectional view showing the basic construction of the present invention.

Referring to FIG. 1, reference numeral 1 designates a projecting optical lens. An object point O is placed above the optical lens 1, and a first solid optical element 2, a liquid 3 and a second solid optical element 4 are disposed along an optical axis C vertically below the optical lens 1. Each of the first and second solid optical elements 2 and 4 comprises a plate-like transparent member of glass, synthetic resin or the like, and is formed with a short cylindrical side wall having, for example, a bottom 5 or 6. The second solid optical element 4 is loosely mounted externally of the first solid optical element 2. The space between the first and second solid optical elements 2 and 4 is freely variable by a driving mechanism, not shown, and said space is filled with the liquid 3.

Accordingly, if the space between the first and second solid optical elements 2 and 4 is varied, the layer thickness of the liquid 3 will be varied and the position of the focus (image point) F of the optical system will change. In this case, if the amount of variation in the layer thickness of the liquid 3 is Δx, the amount of change in position of the focus F is Δy, the refractive index of the liquid 3 is n, and assuming that the apparatus is installed in the atmosphere (refractive index N=1), then the follwing equation results:

$$\Delta y = [(1-N/n)\cdot\Delta x] = [(1-1/n)\cdot\Delta x]$$

As is apparent from this equation, the amount of variation Δx in the layer thickness of the liquid 3 is directly proportional to the amount of change Δy in position of the focus F. If the liquid 3 is thus interposed between the solid optical elements 2 and 4 in a part of the optical path of the projection optical system and the amount of variation Δx in the spacing between the solid optical elements 2 and 4 is changed by manipulation, it will become easy to move the focus F by the amount Δy and the problem of space will be solved. Particularly, since the moved second solid optical element 4 is a parallel flat plate, the displacement of the optical axis resulting from the movement can be minimized.

Also, the amount of liquid 3 which has been discharged from or has been supplied into the region between elements 2 and 4 in accordance with the variation Δx in the layer thickness of the liquid 3 appears as a displacement of the liquid level Δz between the side walls 7 and 8 of the first and second solid optical elements 2 and 4. If the areas of the bottoms 5 and 6 are made larger, this displacement Δz will be usable in observing the amount of variation Δx in the layer thickness of the liquid 3, and consequently, the amount of change Δy in position of the focus F, in an enlarged scale, and thus the resolving power of the position adjustment of the focus F can be improved.

Figure 2:
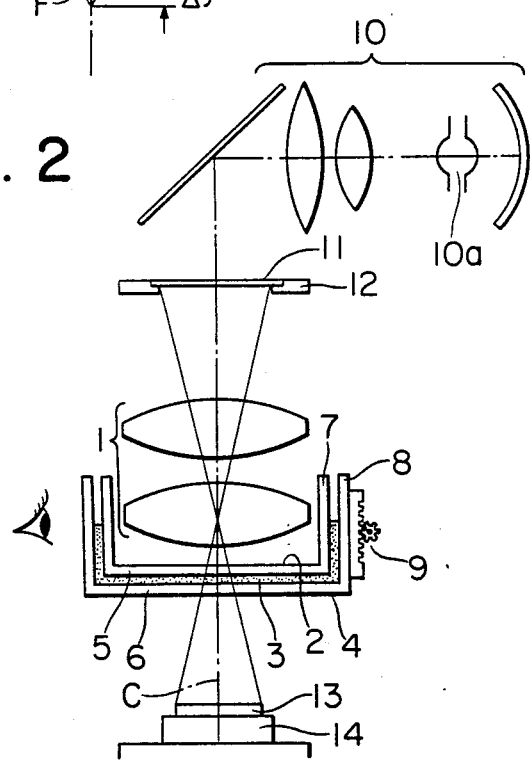
FIG. 2 is a cross-sectional view showing an arrangement incorporated in a mask aligner.

Referring to FIG. 2 which shows a semiconductor circuit pattern projecting exposure device, reference numeral 1 designates the projection lens system which may include a mirror or a spherical mirror therein. The first and second solid optical elements 2 and 4 are disposed so that the parallel flat plate bottoms 5 and 6 of lie at a location whereat the optical axis C of the projection lens 1 is vertical. The space between the solid optical elements 2 and 4 is filled with the liquid 3. Designated by 9 is a position adjuster which comprises a rack and a pinion, the rack being fixed to a side wall 8 of the second solid optical element 4 and the pinion being rotatable by a handle, not shown. Accordingly, when the operator drives the position adjuster 9, the spacing between the bottoms 5 and 6 is varied. Alternatively, the first solid optical element 2 may be moved vertically, or the first and second solid optical elements may be moved in opposite directions.

Reference numeral 10 designates a mask illuminating unit and reference character 10a denotes an illuminating light source such as a mercury lamp. Reference numeral 11 designates a mask provided with a circuit pattern, and reference numeral 12 denotes a mask holder for holding the mask 11 in place on the optical axis C. Reference numeral 13 designates a wafer provided with a photosensitive layer, and reference numeral 14 denotes a wafer chuck which fixes, by suction, the wafer 13.

The spacing between the mask 11 and the wafer 13 is mechanically held constant. Accordingly, in case the image of the mask 11 by the projection lens 1 is not accurately formed on the wafer 13, the bottom 5 is moved up or down by operating the position adjuster 9 so that the image of the mask 11 is formed at a proper position.

The liquid 3 and the bottoms 5 and 6 are transparent to the light from the illuminating light source 10$a$.

Thus, according to the optical focus position adjusting method of the present invention, adjustment of the focus position can be carried out in a optically simple manner. Also, as an application to other fields, the present invention can be used, an example, for a measuring device for optically focusing the degree of concave-concavity of the surface of a body by using the displacement $\Delta z$ enlarged as the amplified amount of change $\Delta y$ in position of the focus.

What I claim is:

1. A projection system comprising:
   a projection optical system for rendering an object plane and an image plane in conjugate relation;
   first and second solid optical means each provided with a planar image-position adjusting portion and disposed between the object plane and the image plane, said first and second optical means being disposed to permit relative movement between said image-position adjusting portions whereby the spacing between said image-position adjusting portions is variable; and
   a liquid filling the space between said image-position adjusting portions.

2. A projection system according to claim 1, wherein each of said solid optical means has a flat bottom, comprising said image-position adjusting portion thereof, and a cylindrical side wall.

3. A projection system according to claim 1, wherein said image-position adjusting portions are disposed at a location where the optical axis of said projection optical system is substantially vertical.

4. A projection system comprising:
   a mask holder for holding a mask on a first reference surface;
   a wafer chuck for supporting a wafer on a second reference surface;
   a projection optical system for rendering said first and second reference surfaces in conjugate relation with each other;
   an imaging-position changing chamber having opposed surfaces, the spacing between which is variable, and disposed between said first and said second reference surfaces;
   a liquid filling said imaging-position changing chamber between said opposed surfaces; and
   means for varying the spacing between said opposed surfaces of said imaging-position changing chamber to change the imaging position of said projection optical system.

5. A projection system according to claim 4, further comprising an indicating portion coupled to the liquid in said imaging-position changing chamber and indicating variation of the liquid level with the variation in the spacing between said opposed surfaces.

* * * * *